(12) United States Patent
Naka (10) Patent No.: US 6,624,625 B2
(45) Date of Patent: Sep. 23, 2003

(54) TEST EQUIPMENT

(75) Inventor: Naoaki Naka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 37 days.

(21) Appl. No.: 10/094,802

(22) Filed: Mar. 12, 2002

(65) Prior Publication Data

US 2003/0016031 A1 Jan. 23, 2003

(30) Foreign Application Priority Data

Jul. 17, 2001 (JP) ........................................ 2001-216506

(51) Int. Cl.[7] .............................................. G01R 31/26
(52) U.S. Cl. .................................... 324/158.1; 324/765
(58) Field of Search ................................ 324/691, 719, 324/525, 765, 158.1, 73.1; 714/724, 733; 333/247

(56) References Cited

U.S. PATENT DOCUMENTS 6,563,298 B1 * 5/2003 Creek et al. ................ 324/765

FOREIGN PATENT DOCUMENTS

| JP | 4-313084 | 11/1992 |
|----|----------|---------|
| JP | 8-220192 | 8/1996 |

* cited by examiner

*Primary Examiner*—John E. Chapman
*Assistant Examiner*—James Kerveros
(74) *Attorney, Agent, or Firm*—Staas & Halsey LLP (57) ABSTRACT

The invented test equipment, includes a circuit under test including a first terminating resistance connected to a first terminal; a first test circuit for outputting a high-speed test signal to said circuit under test via the second terminal; a tester connecting its third terminal to the second terminal of said first test circuit when said first test circuit outputs the high-speed test signal, or connecting a second test circuit for outputting a low-speed test signal to said circuit under test via its third terminal when said first test circuit does not output the high-speed test signal; and a determination circuit for evaluating the outputted signal of said circuit under test. A wiring between the first terminating resistance, the first terminal, the second terminal, the third terminal, and the second terminating resistance is joined in this serial order, when said tester connects the second terminating resistance to the third terminal.

23 Claims, 11 Drawing Sheets

TEST EQUIPMENT

CROSS-REFERENCE TO RELATED APPLICATIONS

This application is based upon and claims priority of Japanese Patent Application No. 2001-216506, filed on Jul. 17, 2001, the contents being incorporated herein by reference.

BACKGROUND OF THE INVENTION

1. Field of the Invention

The present invention relates to a test equipment and, more particularly, to a test equipment which is expected to rapidly complete its task and to check the quality of a semiconductor.

2. Description of the Related Art

The quality of a semiconductor integrated circuit is conventionally checked by utilizing a tester for large-scale semiconductor integrated circuit. As one item in the quality check, it is well-known to carry out a speed-check.

If a semiconductor circuit to be examined is expected to function at high speed over a permissible range of the LSI(Large-scale Integration) tester, the examination can not be attained. An examination equipment shown in FIG. 11 is conventionally used in the art.

Figure 11:
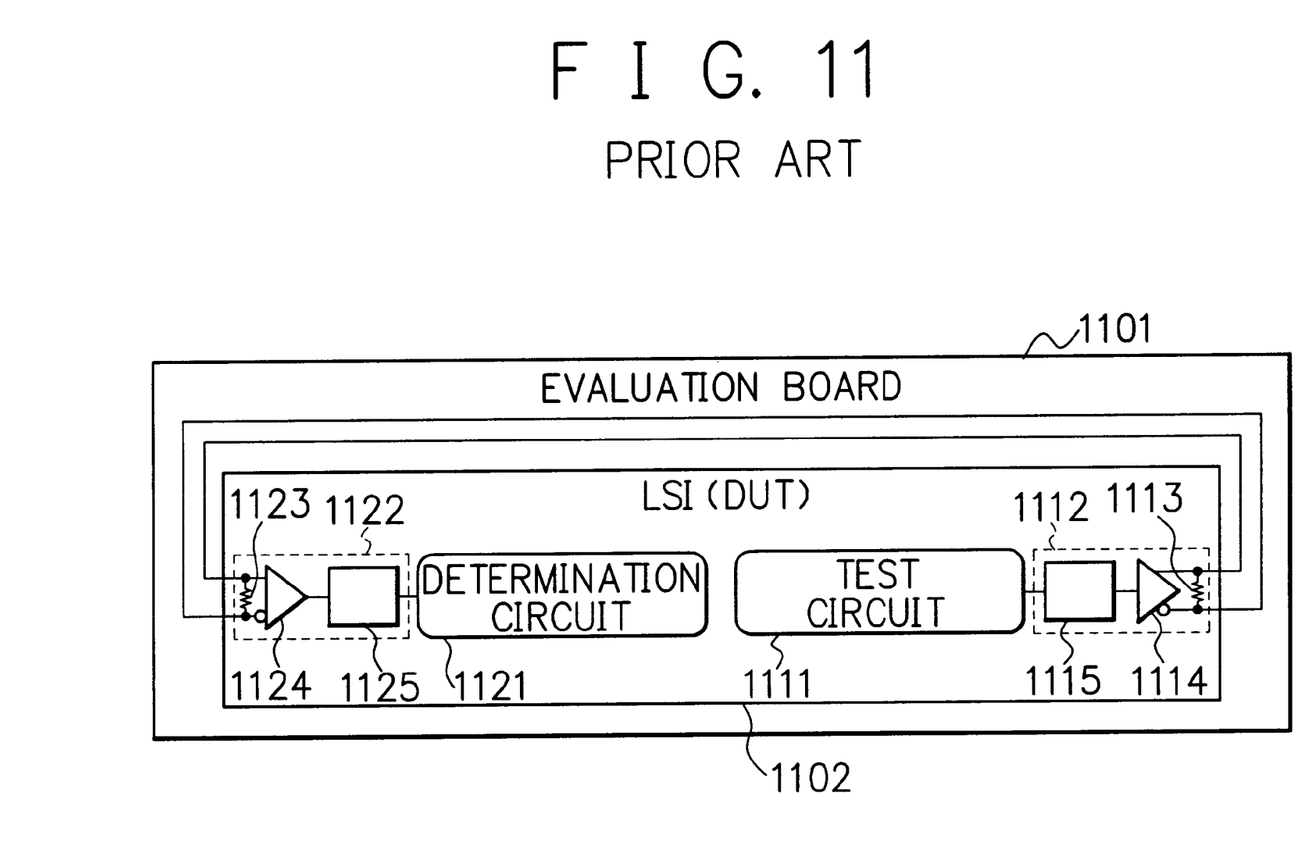
FIG. 11 is a view showing a conventional high-speed test equipment of a semiconductor integrated circuit in the prior art.

A conventional art for accomplishing a high-speed test of an LSI is shown in FIG. 11. The LSI under test (DUT: Device under test) 1102 is connected onto an evaluation board[FT(Final-test) board] 1101. The LSI 1102 comprises a circuit 1122 under test which works as an input section, a determination circuit 1121, a test circuit 1111, and a circuit 1112 under test which works as an output section. The circuit 1122 under test is composed of a terminating resistance 1123, an input buffer 1124, and a processing circuit 1125. The circuit 1112 under test is composed of a terminating resistance 1113, a processing circuit 1115, and an output buffer 1114. The output of the output buffer 1114 and the input of the input buffer 1124 each are connected on the evaluation board 1101. The output of the output buffer 1114 and the input of the input buffer 1124 are connected with the terminating resistances 1113 and 1123, respectively.

The LSI 1102 is capable of outputting high-speed signals from the output buffer 1114 and inputting the high-speed signals into the input buffer 1124. In this high-speed test, a high-speed test signal is outputted from this output buffer 1114 to thereby determine by inputting the signal into the input buffer 1124.

Specifically, the test circuit 1111 outputs the test signal to the circuit 1112 under test. The circuit 1112 under test executes its prescribed process for this test signal and then outputs the result to the circuit 1122 under test. The circuit 1122 under test executes its prescribed process for that inputted signal and then outputs the result to the determination circuit 1121. The determination circuit 1121 is therefore determine the quality of the circuits 1112 and 1122 by evaluating the signal inputted therein.

The conventional LSI test involves the following problems.

(1) The exclusive evaluation board 1101 is inevitable in order to connect the circuit 1112 under test of the output section with the circuit 1122 under test of the input section.

(2) Two tests are necessary, one being a standard test (hereinafter referred to "Low-speed test") on one board by using the tester and the other being the high-speed test with the other board 1101.

(3) When the number of the circuit 1112 under test of the output section and that of the circuit 1122 under test of the input section are not agreed, some circuits under test are left behind the test.

(4) Since the LSI 1102 under test is connected to the evaluation board 1101 via a socket, the impedance becomes large. The circuits 1112, 1122 under test tend to be harmed by noise to thereby invite errors.

SUMMARY OF THE INVENTION

An object of the present invention is to save time for the test by exploiting a single evaluation board which is capable of completing both of the low-speed test and the high-speed test for a circuit under test.

Another object of the present invention is to perform a test for any circuit even when the number the circuit under test of the input section and that of the circuit under test of the output section are not agreed.

Still another object of the present invention is to prevent a noise generation throughout the test.

A preferable aspect of the present invention is provided as a test equipment which comprises: a circuit under test including a first terminating resistance connected to a first terminal; a first test circuit: including a second terminal connected to the first terminal of said circuit under test and excluding a terminating resistance connected to the second terminal for outputting a high-speed test signal to said circuit under test via the second terminal; a tester including a third terminal connected to the second terminal of said first test circuit, the third terminal being connected to the second terminating resistance when said first test circuit outputs the high-speed test signal, or the third terminal being connected to a second test circuit for outputting a low-speed test signal to said circuit under test via the third terminal when said first test circuit does not output the high-speed test signal; and a determination circuit for evaluating the outputted signal of said circuit under test. In this structure, a wiring between the first terminating resistance, the first terminal, the second terminal, the third terminal, and the second terminating resistance is joined in this serial order, when said tester connects the second terminating resistance to the third terminal.

Accordingly, the first test circuit outputs the high-speed test signal to the circuit under test, while the second circuit under test outputs the low-speed test signal to the circuit under test. It is therefore achieved to carry out both of the high-speed and low-speed tests on the single evaluation board to thereby save time for the test.

As the circuit under test and the first test circuit each are independent semiconductor chips, all the circuits under test can be examined well even when the numbers are different between the circuit under test as the input section and the circuit under test as the output section.

The semiconductor chip of the circuit under test is connected to the evaluation board via the socket, and the semiconductor chip of the first test circuit is directly connected to the same evaluation board to thereby prevent a noise generation throughout the test and an error state of the equipment due to the noise.

DETAILED DESCRIPTION OF THE PREFERRED EMBODIMENTS

First Embodiment

Figure 1:
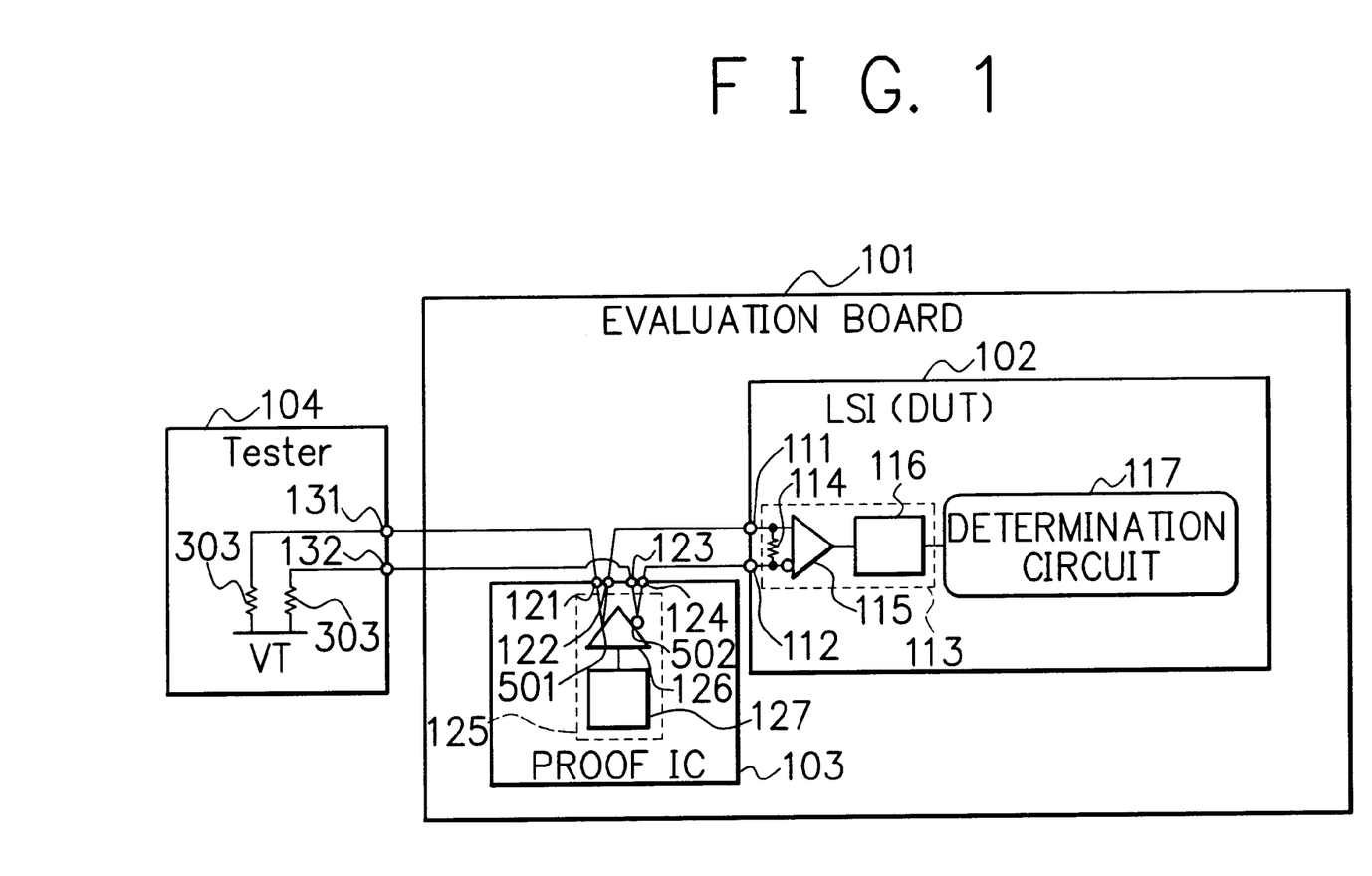
FIG. 1 is a view showing a high-speed test equipment of a semiconductor integrated circuit in a first embodiment of the present invention.

FIG. 1 shows a test equipment for carrying out a high-speed test for a semiconductor integrated circuit in this first embodiment according to the present invention. The quality of an LSI 102 is generally checked by using a tester 104 (hereinafter referred to as a "Low-speed test"). As one item in this quality check, a speed-check is included. A preferable test equipment is shown in FIG. 1, in which the test is performed for the LSI 102 at its high-speed which exceeds a permissible range of the tester 104.

The LSI 102 under test (DUT: Device under test) and a proof IC (an integrated circuit) 103 each are connected on an evaluation board [FT(Final-test) board] 101. The proof IC 103 is connected with the tester 104. These LSI 102, proof IC 103, and tester 104 each are independent semiconductor chips.

The proof IC 103 has terminals 121 to 124 and includes a test circuit 125. The test circuit 125 has an internal test circuit 127 and a difference output buffer 126. The internal test circuit 127 outputs a high-speed test signal to the buffer 126. The output buffer 126 outputs a high-speed difference test signal from terminals 501, 502. The impedance of the outputs from the output buffer 126 is large. The terminal 501 is separately connected with the terminals 121 and 122 not to intersect to each other. The terminal. 502 is also separately connected with the terminals 123 and 124 not to intersect to each other. Between these terminals 501 and 502, there is no terminating resistance.

The LSI 102 comprises difference input terminals 111, 112, a circuit 113 under test as an input section, and a determination circuit 117. The terminals 111 and 112 are connected with the terminals 122 and 124 of the proof IC 103, respectively. The circuit 113 under test includes a terminating resistance 114, a difference input buffer 115, and a processing circuit 116. This terminating resistance 114 is disposed between the terminals 111 and 112. The input buffer 115 receives the high-speed difference test signals from the proof IC 103 through the difference input terminals 111, 112 and outputs them to the processing circuit 116. The processing circuit 116 executes its prescribed process for the inputted test signals and outputs them to the determination circuit 117.

The determination circuit 117 checks the quality of the circuit 113 under test by receiving the output signal of the processing circuit 116 as the outputted signal from the circuit 113 under test and determining the thus-received signal.

The tester 104 has terminals 131, 132 and includes a terminating resistance 303. The terminals 131 and 132 are respectively connected with the terminals 121 and 123 of the proof IC 103. The two terminating resistances 303 are respectively inserted between the terminals 131, 132 and a terminated voltage VT.

In this test equipment, the high-speed test is conducted with a high frequency test signal, so that an impedance-matching of wiring is necessary in order to prevent the reflex of signal. One wiring connects the terminals 131, 121, 501, 122, 111 in this serial order. The other wiring connects the terminals 132, 123, 502, 124, 112 in this serial order. These two wirings do not intersect to each other.

At the output terminal 501 or 502, there is no branch because of high-impedance of the output from output buffer 126. The terminating resistances 303 and 114 are introduced at both ends of the wirings for the impedance-matching of the two wirings. The impedance-matching functions to prevent the reflex of signal when issuing the high-speed test signal to the wiring to thereby prevent a noise generation during the test.

Figure 2:
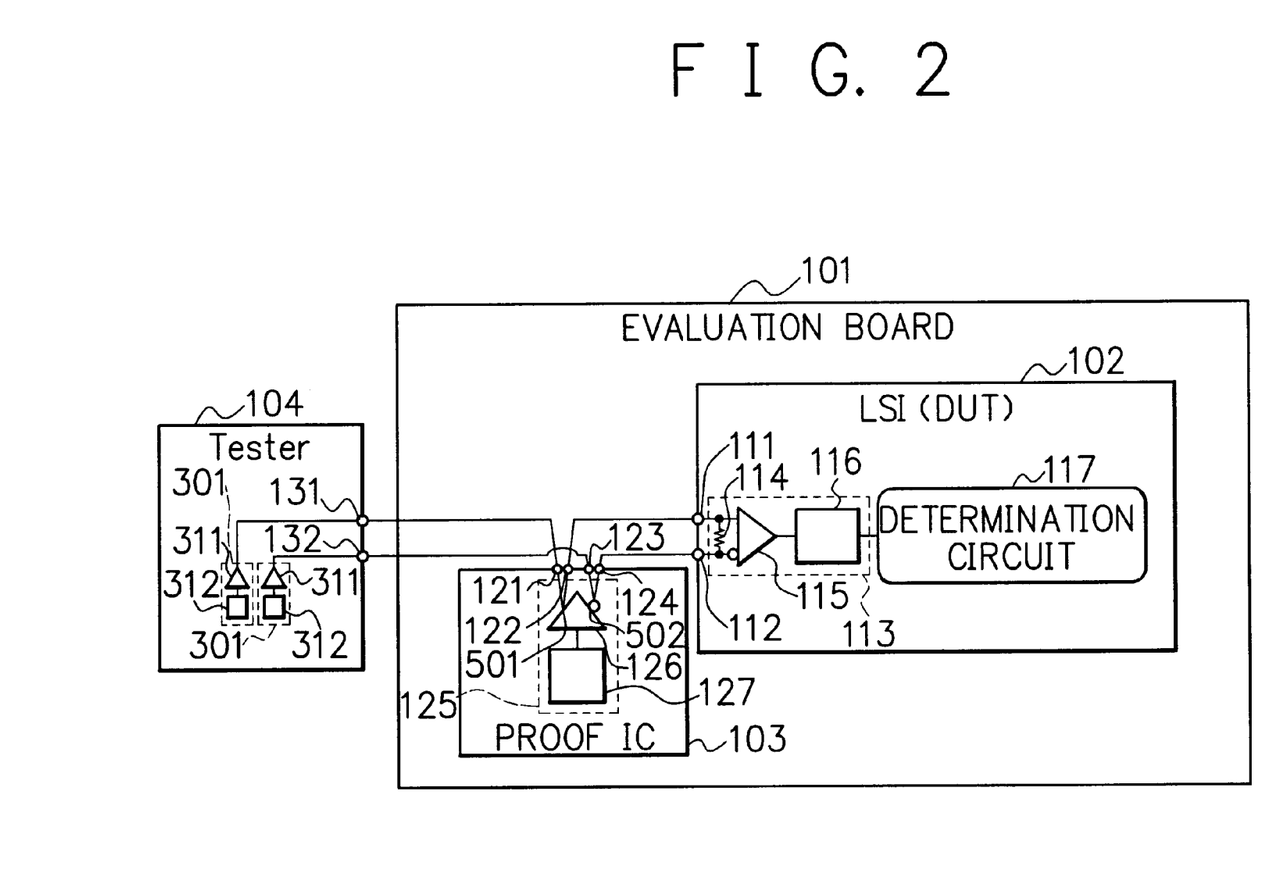
FIG. 2 is a view showing a low-speed test equipment of the semiconductor integrated circuit in the first embodiment.

FIG. 2 shows a test equipment for carrying out a low-speed test for a semiconductor integrated circuit. The difference of this test equipment in structure is the internal arrangement of the tester 104 which is used in the test equipment shown in FIG. 1. In the tester 104, there are provided test circuits 301 to the terminals 131 and 132, respectively. The test circuit 301 includes an internal test circuit 312 for outputting a low-speed test signal and an output buffer 311 for outputting its low-speed test signal. The one test circuit 301 outputs the low-speed test signal, through the terminals 131, 121, 501, 122, and 111, to the circuit 113 under test. The other test circuit 301 outputs the low-speed test signal, through the terminals 132, 123, 502, 124, and 112, to the circuit 113 under test. In this process, the output buffer 126 of the proof IC 103 does not output the high-speed test signal. The tester 104 outputs various low-speed test signals for the standard test of the LSI. The determination circuit 117 checks the quality of the circuit 113 under test based on the output signal from the circuit 113.

During the low-speed test, since the test signal presents a low frequency, there is hardly any reflex of signal. It is therefore unnecessary to use a terminating resistance in the tester 104.

Figure 3:
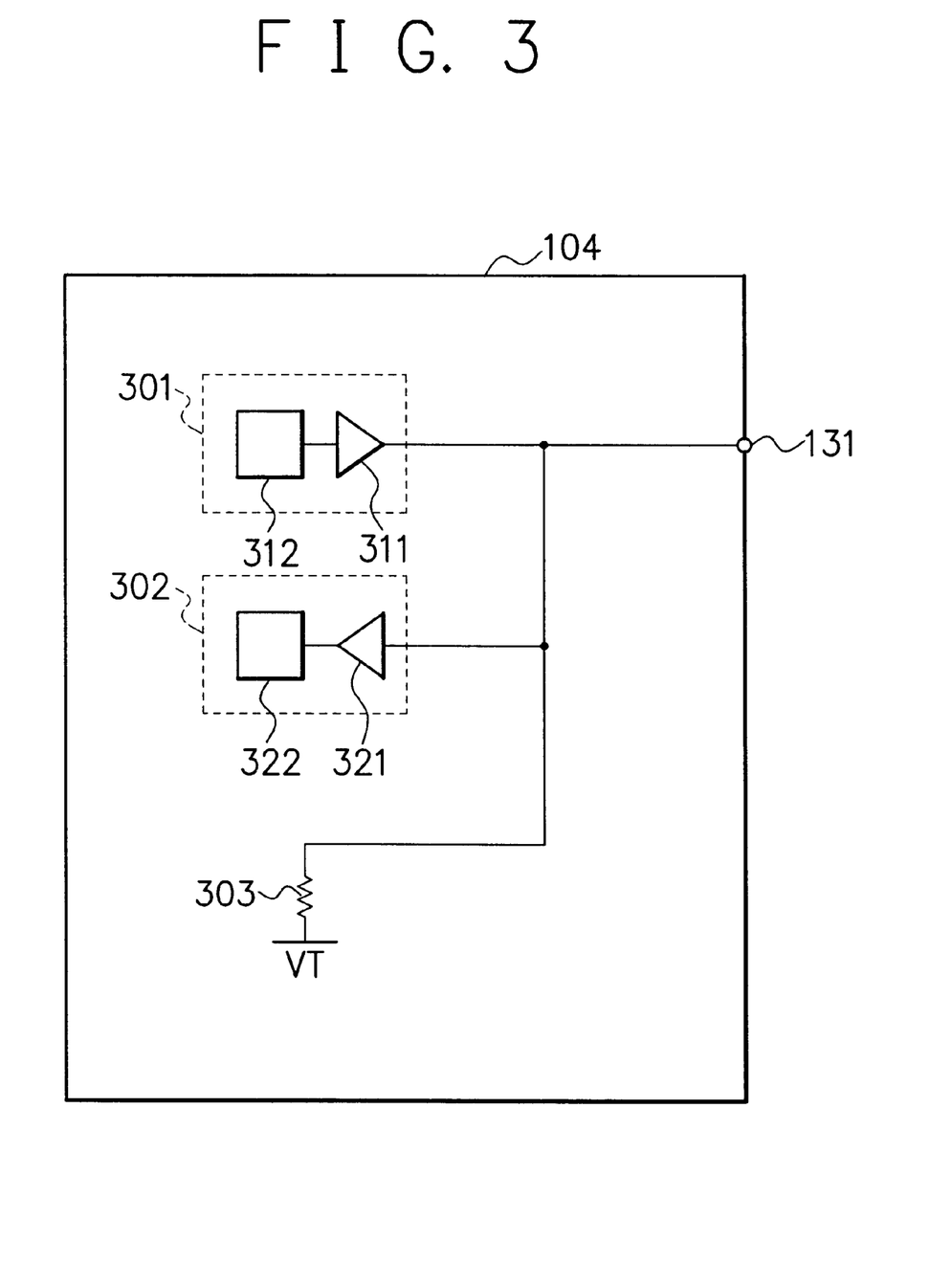
FIG. 3 is a view showing an internal arrangement of a tester.

FIG. 3 shows the structure of the tester 104. The terminal 131 is so provided as to connect with any one of the test circuits 301, the determination circuit 302, and the terminating resistance 303. The other terminal 132 is also capable of connecting with any of them. In the tester 104, the terminating resistance 303 connects with the terminal 131 in the high-speed test shown in FIG. 1, while the test circuit 301 connects with the terminal 131 in the low-speed test shown in FIG. 2. The details of the determination circuit 302 will be explained later on.

Figure 4:
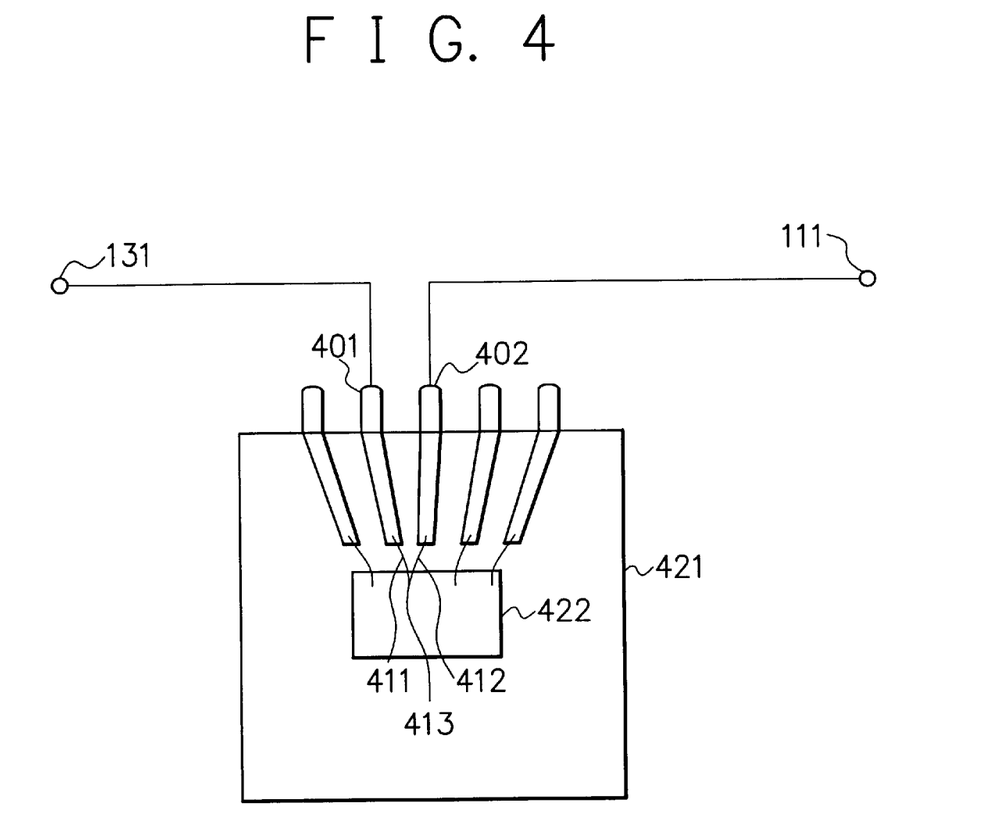
FIG. 4 is a view showing a wiring of a proof IC.

FIG. 4 shows the proof IC 103 and its internal wiring state. In the proof IC 103, a semiconductor chip 422 is accommodated in a package 421 and leads 401, 402 are connected with the semiconductor chip 422 by bonding wires 411, 412. The terminal 131 is connected with a bonding pad 413 through the lead 401 and the boding wire 411. The terminal 111 is connected with the bonding pad 413 through the lead 401 and the bonding wire 412.

The lead 401 corresponds to the terminal 121, the lead 402 to the terminal 122, and the bonding pad 413 to the terminal 501. The terminals 131 and 111 are connected with the boding pad 413 not to intersect to each other even in the package 421 of the proof IC.

Figure 5A:
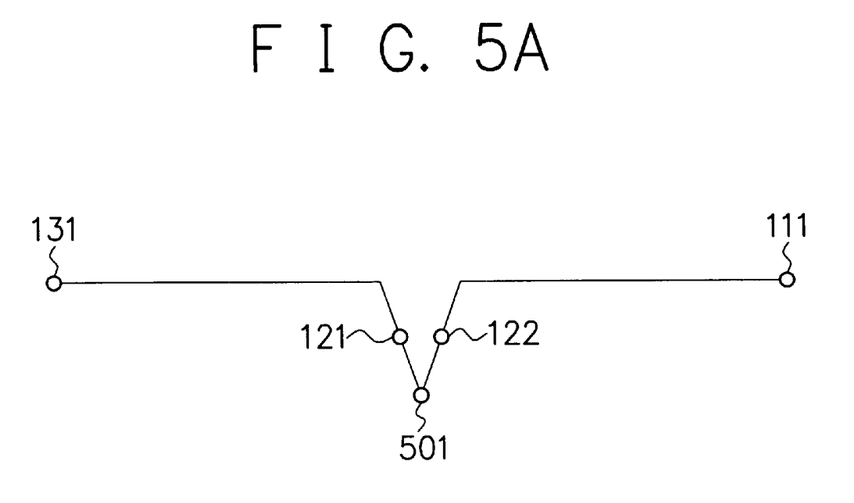
FIGS. 5A and 5B are views showing wirings between the terminals.
Figure 5B:
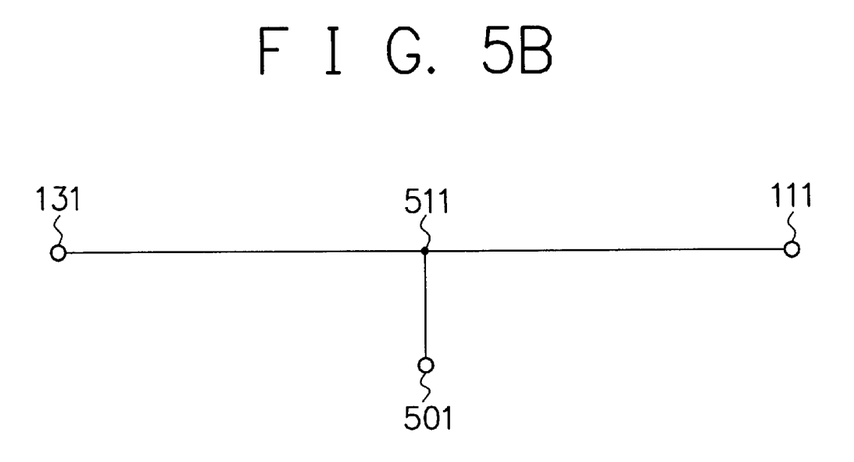

As can be seen from FIG. 5A, the wiring connects the terminals 131, 121, 501, 122, 111 in this serial order. If the terminals 131 and 111 are connected with the same lead, there is an intersecting wiring between the terminals 131 and 111, as shown in FIG. 5B to thereby appear a branch 511. The presence of the branch 511 cause such problems that the impedance-matching is not performed with the terminating resistance, the reflex of signal comes out at the branch 511, and the noise is generated in the test signal. This embodiment can prevent the reflex of signal because of the wiring as shown in FIG. 4 and no branch as shown in FIG. 5A.

Figure 6:
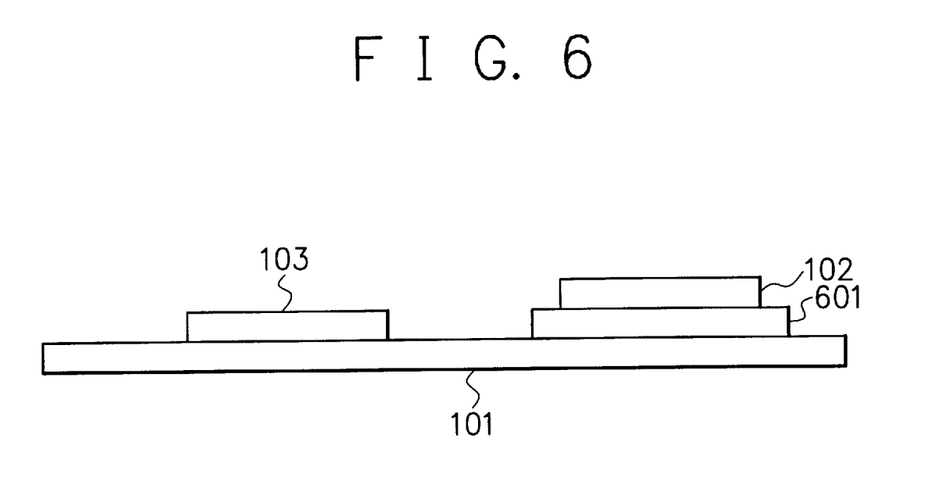
FIG. 6 is a view showing a connecting state on an evaluation board.

FIG. 6 shows the connecting state of the proof IC 103 and the LSI 102 on the evaluation board 101. The LSI 102 is a device under test, so that it is detachably attached to the evaluation board 101 via a socket 601. The proof IC 103 is directly put and mounted on the same evaluation board 101 by soldering, since it is not required to be detached.

Now reviewing the test equipment in FIG. 11, the LSI 1102 is connected to the evaluation board 1101 via the socket. The socket causes noise because of its high-impedance. In this arrangement, the circuit 1112 as the output section outputs the signal via the socket, and the circuit 1122 as the input section inputs the signal via the socket, too. There are two problematic sockets at the output and input sections, which generate serious noise to thereby cause an error state of the equipment.

The first embodiment shown in FIG. 6 introduces, however, only one socket to the LSI 102 with no socket to the proof IC 103. The number of the sockets is limited to one, which contributes noise reduction and assure a normal state of the equipment.

Accordingly, in the high-speed test as shown in FIG. 1, the test circuit 125 outputs the high-speed test signal to the circuit 113 under test. In the low-speed test as shown in FIG. 2, the test circuit 301 outputs the low-speed test signal to the circuit 113 under test. It is therefore achieved to carry out both of the high-speed and low-speed tests on the single evaluation board 101 to thereby save time for the test.

In this first embodiment, how to examine the circuit 113 as the input section has been explained. Next, how to examine the circuit under test as the output section will be explained as a second embodiment.

Second Embodiment

Figure 7:
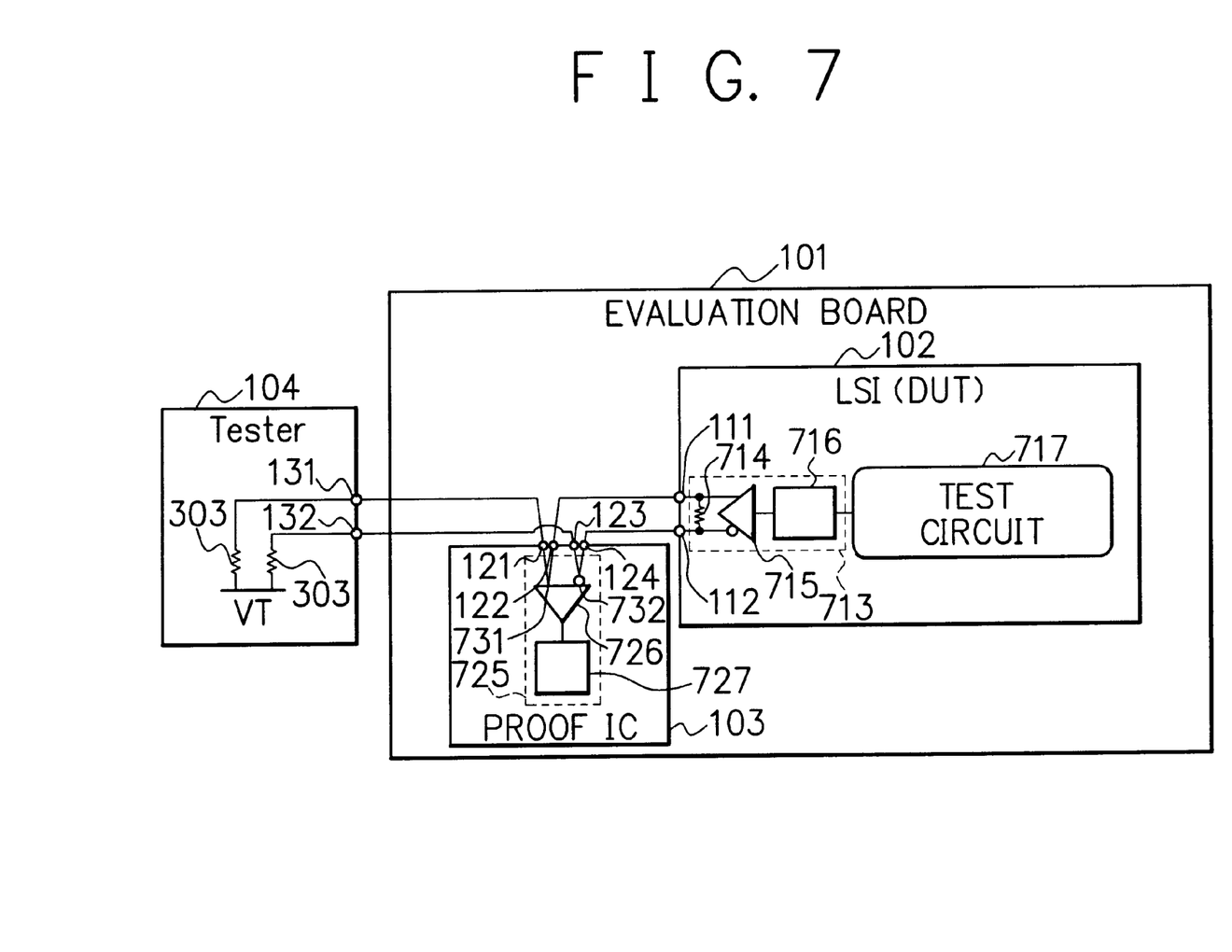
FIG. 7 is a view showing a high-speed test equipment of a semiconductor integrated circuit in a second embodiment of the present invention.

FIG. 7 shows a test equipment for carrying out a high-speed test for a semiconductor integrated circuit in this second embodiment according to the present invention. An LSI 102 under test and a proof IC 103 each are connected on an evaluation board 101. The proof IC 103 is connected with a tester 104. These LSI 102, proof IC 103, and tester 104 each are independent semiconductor chips.

The LSI 102 has difference output terminals 111, 112 and includes a circuit 713 under test and a test circuit 717. The circuit 713 under test is composed of a processing circuit 716, a differential output buffer 715, and a terminating resistance 714. The terminating resistance 714 is disposed between the terminals 111 and 112. The test circuit 717 outputs a high-speed test signal to the processing circuit 716. The processing circuit 716 executes its prescribed process for the inputted test signal and outputs a differential test signal from the terminals 111, 112 via the output buffer 715.

The proof IC 103 has terminals 121 to 124 and includes a test circuit 725. The test circuit 725 has a difference input buffer 726 and an internal test circuit 727. The input buffer 726 inputs a high-speed difference test signal from the LSI 102 to the terminals 731 and 732 via the difference input terminals 122 and 124 and outputs it to the internal test circuit 727. The internal test circuit 727 examines the quality of the circuit 713 under test by evaluating the outputted signal of the input buffer 726. The impedance of the input of the input buffer 726 is large. Between the terminals 731 and 732, there is not terminating resistance.

The tester 104 includes terminals 131, 132 and includes a terminating resistance 303. The terminals 131 and 132 are respectively connected with the terminals 731 and 732 via the terminals 121 and 123 of the proof IC 103. The two terminating resistances 303 are respectively inserted between the terminals 131, 132 and a terminated voltage VT.

One wiring connects the terminals 131, 121, 731, 122, 111 in this serial order. The other wiring connects the terminals 132, 123, 732, 124, 112 in this serial order. These two wirings do not intersect to each other.

At the input terminal 731 or 732, there is no branch because of high-impedance of the input of input buffer 726. The terminating resistances 303 and 714 are introduced at both ends of the wirings for the impedance-matching of the two wirings. The impedance-matching functions to prevent the reflex of signal when issuing the high-speed test signal to the wiring to thereby prevent a noise generation during the test.

Figure 8:
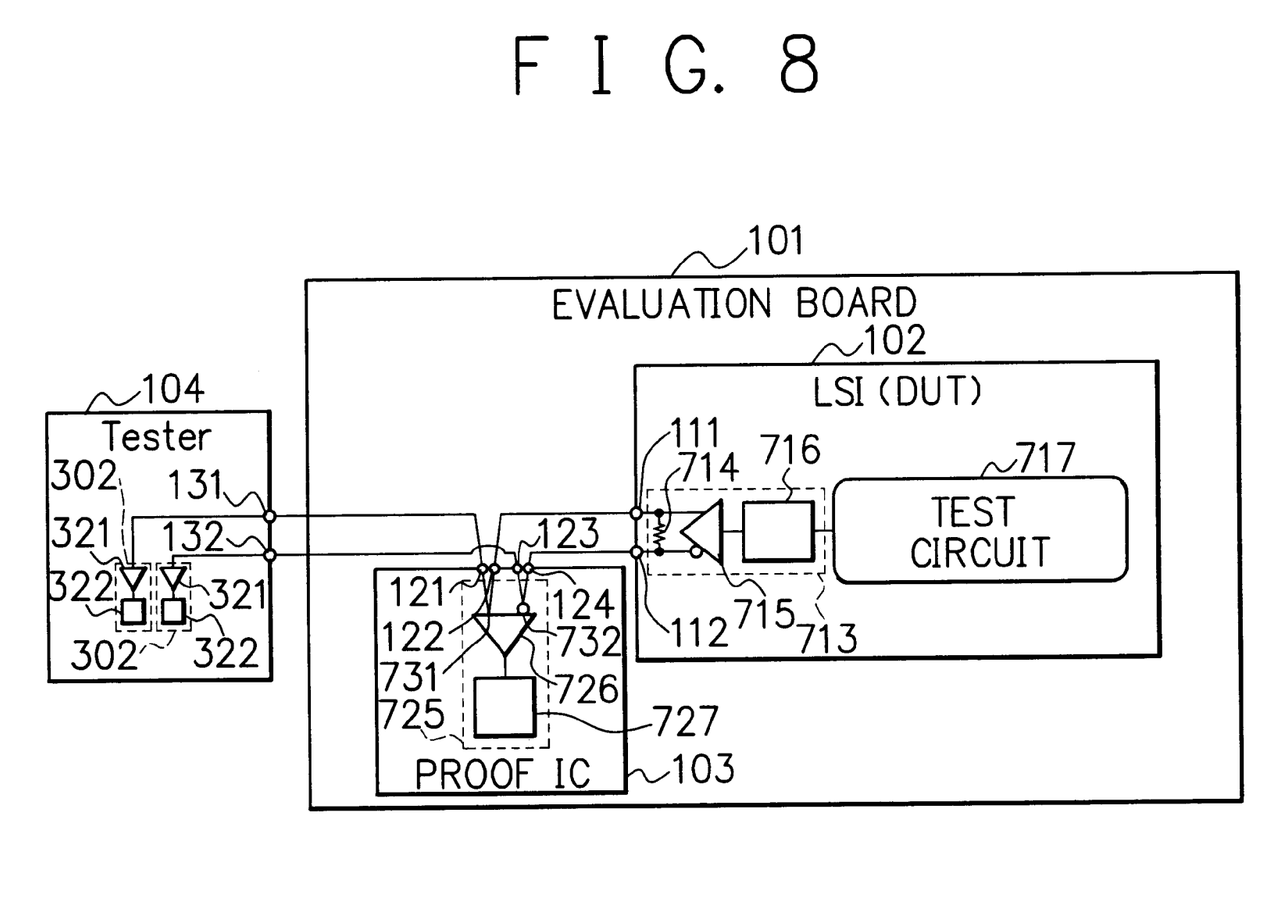
FIG. 8 is a view showing a low-speed test equipment of the semiconductor integrated circuit in the second embodiment.

FIG. 8 shows a test equipment for carrying out a low-speed test for a semiconductor integrated circuit. The difference of this test equipment in structure is the internal arrangement of the tester 104 which is used in the test equipment shown in FIG. 7. In the tester 104, there are provided test circuits 302(See FIG. 3) to the terminals 131 and 132, respectively. The test circuit 302 includes an input buffer 321 for inputting a low-speed test signal and an internal test circuit 322 for evaluating its low-speed test signal. The one test circuit 302 inputs the low-speed test signal, through the terminals 111, 122, 731, 121, and 131, from the circuit 713 under test. The other test circuit 302 inputs the low-speed test signal, through the terminals 112, 124, 732, 123, and 132, from the circuit 713 under test. The tester 104 outputs various low-speed test signals for the standard test of the LSI.

During the low-speed test, since the test signal presents a low frequency, it is therefore unnecessary to use terminating resistance in the tester 104.

It is therefore achieved, even in the test for the circuit 713 under test as the output section, to carry out both of the high-speed and low-speed tests on the single evaluation board 101 to thereby save time for the test.

In the first embodiment, how to examine the circuit 113 as the input section has been explained, as well as, in this second embodiment, how to examine the circuit 713 as the output section has been explained. Next, how to examine the circuit under test as the input and output sections will be explained as a third embodiment.

Third Embodiment

Figure 9:
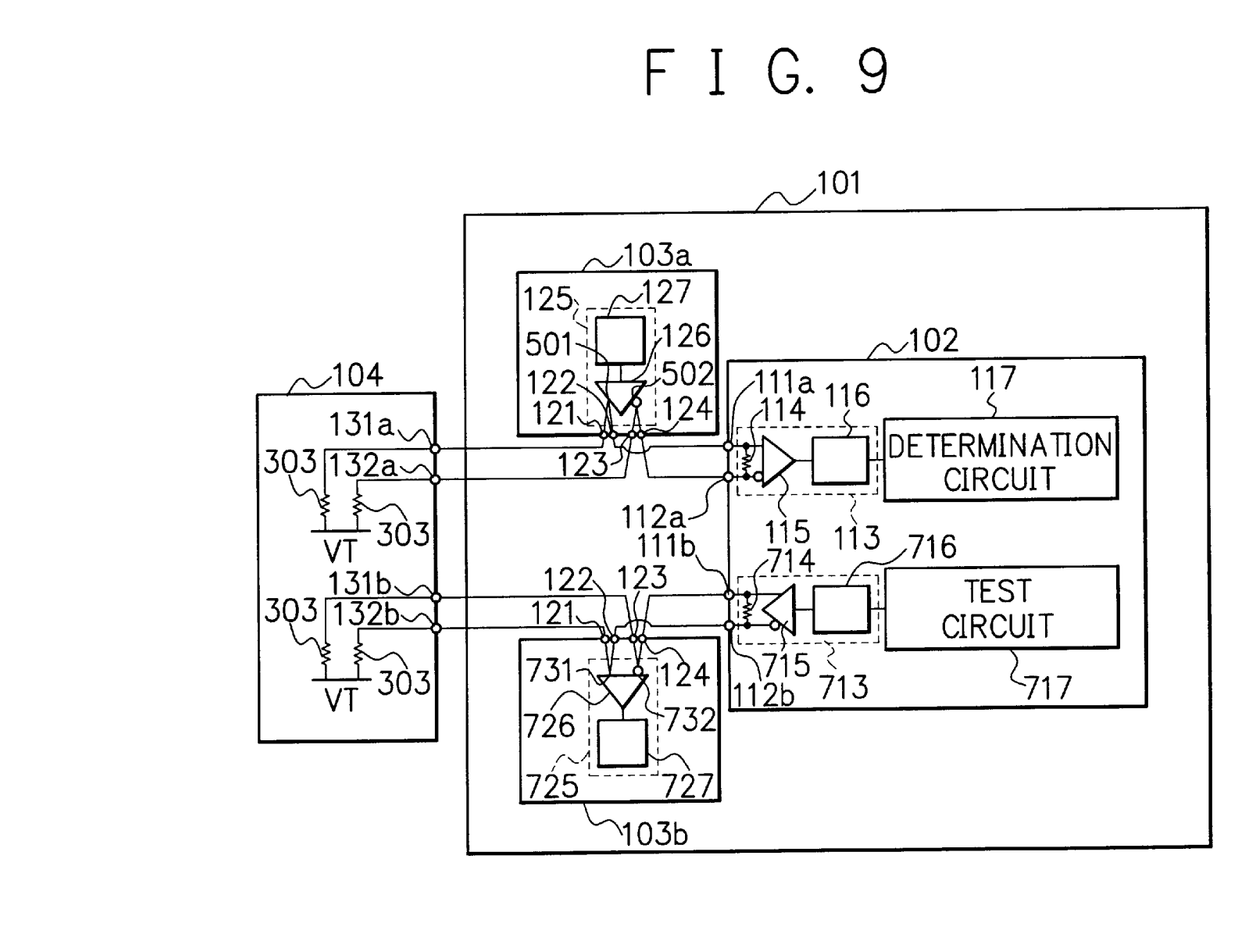
FIG. 9 is a view showing a high-speed test equipment of a semiconductor integrated circuit in a third embodiment of the present invention.

FIG. 9 shows a test equipment for carrying out a high-speed test for a semiconductor integrated circuit in this third embodiment according to the present invention. The LSI 102 under test and proof ICs 103a, 103b each are connected on an evaluation board 101. The proof ICs 103a, 103b are connected with a tester 104. These LSI 102, proof ICs 103a, 103b, and tester 104 each are independent semiconductor chips.

The corresponding elements to the test equipment of the first embodiment in FIG. 1 are a determination circuit 117, a circuit 113 under test, a proof IC 103a, terminals 131a and 132a of the tester 104, and terminating resistances 303 connected thereto. The proof IC 103a corresponds to the proof IC 103 shown in FIG. 1. The terminals 131a and 132a correspond to the terminals 131 and 132 in FIG. 1.

The corresponding elements to the test equipment of the second embodiment in FIG. 7 are a determination circuit 717, a circuit 713 under test, a proof IC 103b, terminals 131b and 132b of the tester 104, and terminating resistances 303 connected thereto. The proof IC 103b corresponds to the proof IC 103 shown in FIG. 7. The terminals 131b and 132b correspond to the terminals 131 and 132 in FIG. 7.

The tester 104 is composed of the tester 104 in FIG. 1 and the tester 104 in FIG. 7 in the same semiconductor chip. The LSI 102 comprises a circuit 113 under test which works as an input section, a determination circuit 117, a circuit 713 under test which works as an output section and a test circuit 717 in the same semiconductor chip. The LSI 102 is connected to the evaluation board 101 via the socket as that in FIG. 6. The proof ICs 103a, 103b each are connected on the same evaluation board 101.

Figure 10:
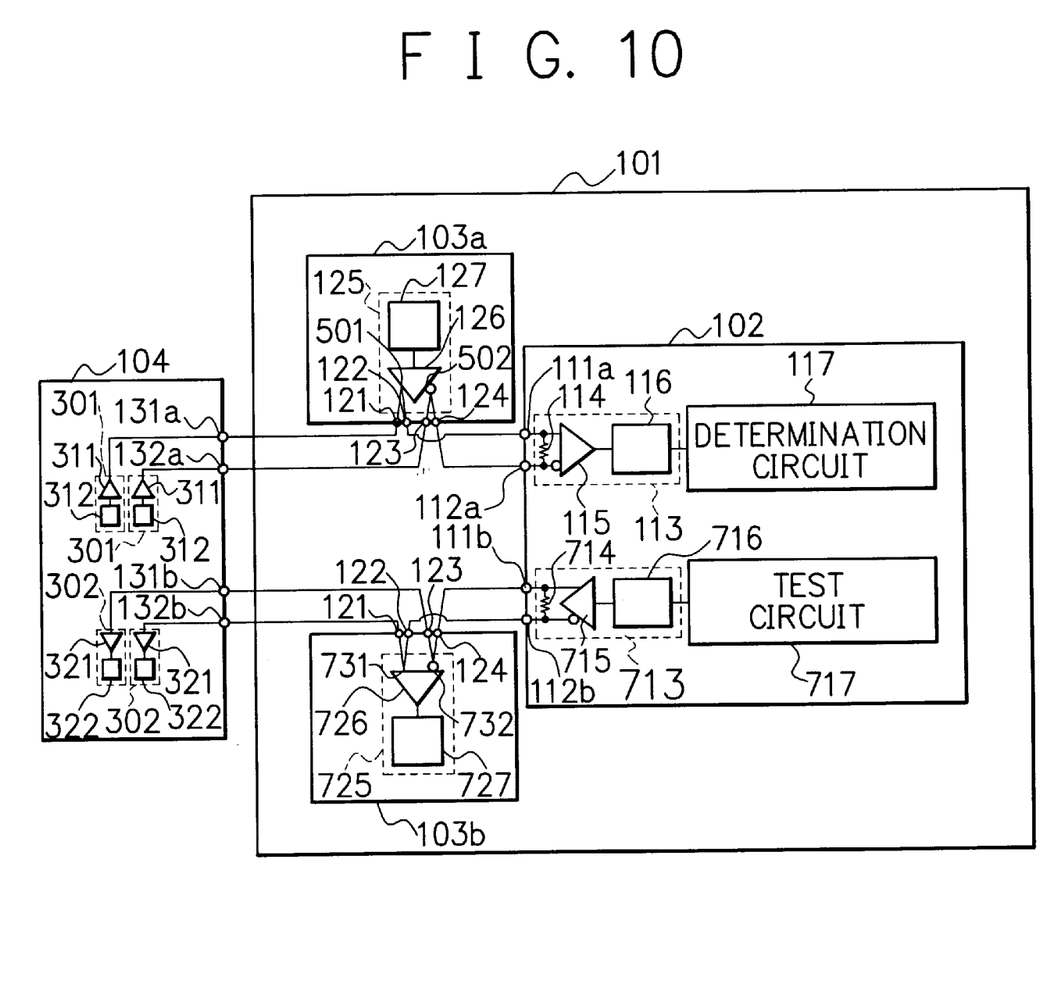
FIG. 10 is a view showing a low-speed test equipment of the semiconductor integrated circuit in the third embodiment.

FIG. 10 shows a test equipment for carrying out a low-speed test for a semiconductor integrated circuit. The difference of this test equipment in structure is the internal arrangement of the tester 104 of the test equipment shown in FIG. 9. In the tester 104, the terminals 131a and 132a are respectively connected with the test circuits 301 as seen from the first embodiment in FIG. 2. The terminals 131b and 132b are respectively connected with the test circuits 302 as seen from the second embodiment in FIG. 8.

It is therefore achieved, even when the LSI 102 including the circuits 113, 713 under test as the input and output sections is checked, to carry out both of the high-speed and low-speed tests on the single evaluation board 101 to thereby save time for the test.

The test equipment in FIG. 11 may cause such problems that some circuits under test are left behind the test when the number of the circuit 1112 under test of the output section and that of the circuit 1122 under test of the input section are not agreed. Accordingly, the same number of the proof IC 103a, as that of the circuit 113 under test as the input section, are employed, while the same number of the proof IC 103b, as that of the circuit 713 under test as the output section, are employed. Since there are provided plural proof ICs 103a and 10b on the evaluation board 101, it can deal with several circuits under test as the input and output sections.

As the LSI 102, which includes the circuits 113, 713 under test, and the proof ICs 103a, 103b each are independent semiconductor chips, all the circuits under test can be examined well even when the numbers are different between the circuit 113 under test as the input section and the circuit 713 under test as the output section.

The high-speed test signal and output signal used in the wirings are signals having the frequency 200 MHz or more, while the low-speed test signal and output signal are recommended to have the frequency less than 200 MHz. More preferably, the high-speed test signal and output signal used in the wirings are signals having the frequency 500 MHz or more, while the low-speed test signal and output signal are recommended to have the frequency less than 500 MHz.

As has been described above, the first test circuit outputs the high-speed test signal to the circuit under test, while the second circuit under test outputs the low-speed test signal to the circuit under test. It is therefore achieved to carry out both of the high-speed and low-speed tests on the single evaluation board to thereby save time for the test.

As the circuit under test and the first test circuit each are independent semiconductor chips, all the circuits under test can be examined well even when the numbers are different between the circuit under test as the input section and the circuit under test as the output section.

The semiconductor chip of the circuit under test is connected to the evaluation board via the socket, and the semiconductor chip of the first test circuit is directly connected to the same evaluation board to thereby prevent a noise generation throughout the test and an error state of the equipment due to the noise.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A test equipment, comprising:
   a circuit under test including a first terminating resistance connected to a first terminal;
   a first test circuit including a second terminal connected to the first terminal of said circuit under test and excluding a further terminating resistance connected to the second terminal for outputting a high-speed test signal to said circuit under test via the second terminal;
   a tester including a third terminal connected to the second terminal of said first test circuit, the third terminal being connected to a second terminating resistance when said first test circuit outputs the high-speed test signal, or the third terminal being connected to a second test circuit for outputting a low-speed test signal to said circuit under test via the third terminal when said first test circuit does not output the high-speed test signal; and
   a determination circuit for evaluating the outputted signal of said circuit under test, and
   wherein a wiring between the first terminating resistance, the first terminal, the second the third terminal, and the second terminating resistance is joined in this serial order, terminal, when said tester connects the second terminating resistance to the third terminal.

2. The test equipment according to claim 1, wherein said circuit under test, first test circuit, and tester each are independent semiconductor chips.

3. The test equipment according to claim 2, wherein said semiconductor chip including said circuit under test is connected to an evaluation board via a socket, and said semiconductor chip including said first test circuit is directly connected to the same evaluation board.

4. The test equipment according to claim 3, wherein the first and third terminals are connected to the second terminal not to intersect to each other in a package of said semiconductor chip including said first test circuit.

5. The test equipment according to claim 4, wherein the first terminal is connected to the second terminal via a first lead and a first bonding wire of said semiconductor chip including said first test circuit, and the third terminal is connected to the second terminal via a second lead and a second bonding wire which differ from the first lead and the first bonding wire of said semiconductor chip including said first test circuit.

6. The test equipment according to claim 5, wherein the first and second terminating resistances are provided to obtain impedance matching of the wiring between the first terminating resistance, the first terminal, the second terminal, the third terminal, and the second terminating resistance.

7. The test equipment according to claim 6, wherein the high-speed test signal has the frequency 200 MHz or more, and the low-speed test signal has the frequency less than 200 MHz.

8. A test equipment, comprising:
a circuit under test including a first terminating resistance connected to a first terminal;
a test circuit for outputting a test signal to said circuit under test;
a first determination circuit including a second terminal connected to the first terminal of said circuit under test and excluding a further terminating resistance connected to the second terminal for inputting a high-speed output signal of said circuit under test via the second terminal to thereby evaluate the output signal; and
a tester including a third terminal connected to the second terminal of said first determination circuit, the third terminal being connected to a second terminating resistance when said circuit under test outputs the high-speed output signal, or the third terminal being connected to a second determination circuit for inputting a low-speed output signal of said circuit under test via the third terminal, when said circuit under test outputs the low-speed output signal, to thereby evaluate the output signal, wherein
a wiring between the first terminating resistance, the first terminal, the second terminal, the third terminal, and the second terminating resistance is joined in this serial order, when said tester connects the second terminating resistance to the third terminal.

9. The test equipment according to claim 8, wherein said circuit under test first determination circuit and tester each are independent semiconductor chips.

10. The test equipment according to claim 9, wherein said semiconductor chip including said circuit under test is connected to an evaluation board via a socket, and said semiconductor chip including said first test circuit is directly connected to the same evaluation board.

11. The test equipment according to claim 10, wherein the first and third terminals are connected to the second terminal not to intersect to each other in a package of said semiconductor chip including said first determination circuit.

12. The test equipment according to claim 11, wherein the first terminal is connected to the second terminal via a first lead and a first bonding wire of said semiconductor chip including said first determination circuit, and the third terminal is connected to the second terminal via a second lead and a second bonding wire which differ from the first lead and the first bonding wire of said semiconductor chip including said first determination circuit.

13. The test equipment according to claim 12, wherein the first and second terminating resistances are provided to obtain impedance matching of the wiring between the first terminating resistance, the first terminal, the second terminal, the third terminal, and the second terminating resistance.

14. The test equipment according to claim 13, wherein the high-speed output signal has the frequency 200 MHz or more, and the low-speed output signal has the frequency less than 200 MHz.

15. A test equipment comprising:
a first circuit under test including a first terminating resistance connected to a first terminal;
a first test circuit including a second terminal connected to the first terminal of said first circuit under test and excluding a first further terminating resistance connected to the second terminal for outputting a high-speed test signal to said first circuit under test via the second terminal;
a first tester including a third terminal connected to the second terminal of said first test circuit, the third terminal being connected to a second terminating resistance when said first test circuit outputs the high-speed test signal, or the third terminal being connected to a second test circuit for outputting a low-speed test signal to said circuit under test via the third terminal when said first test circuit does not output the high-speed test signal;
a first determination circuit for evaluating the outputted signal of said circuit under test;
a second circuit under test including a third terminating resistance connected to a fourth terminal;
a third test circuit for outputting a test signal to said second circuit under test;
a second determination circuit including a fifth terminal connected to the fourth terminal of said second circuit under test and excluding a second further terminating resistance connected to the fifth terminal for inputting a high-speed output signal of said second circuit under test via the fifth terminal to thereby evaluate the output signal; and
a second tester including a sixth terminal connected to the fifth terminal of said second determination circuit, the sixth terminal being connected to a fourth terminating resistance when said second circuit under test outputs the high-speed output signal, or the sixth terminal being connected to a third determination circuit for inputting a low-speed output signal of said second circuit under test via the sixth terminal, when said second circuit under test outputs the low-speed output signal, to thereby evaluate the output signal, wherein: a wiring between the first terminating resistance, the first terminal, the second terminal, the third terminal, and the second terminating resistance is joined in this serial order, when said first tester connects the second terminating resistance to the third terminal, and
a wiring between the third terminating resistance, the fourth terminal, the fifth terminal, the sixth terminal, and the fourth terminating resistance is pined in this serial order, when said second tester connects the fourth terminating resistance to the sixth terminal.

16. The test equipment according to claim 15, wherein said first and second testers are provided as the same semiconductor chip.

17. The test equipment according to claim 16, wherein said first and second circuits under test are provided as the same semiconductor chip.

18. The test equipment according to claim 17, wherein said first circuit under test said first test circuit, and said first tester each are independent semiconductor chips, and said second circuit under test, said second test circuit, and said second tester each are independent semiconductor chips.

19. The test equipment according to claim 18, wherein said semiconductor chip including said first and second circuits under test are connected to an evaluation board via a socket, and said one or more semiconductor chips including said first test circuit and said second determination circuit are directly connected to the same evaluation board.

20. The test equipment according to claim 19, wherein the first and third terminals are connected to the second terminal not to intersect to each other in a package of said semiconductor chip including said first test circuit, and the fourth and sixth terminals are connected to the fifth terminal not to intersect to each other in a package of said semiconductor chip including said second test circuit.

21. The test equipment according to claim 20, wherein the first terminal is connected to the second terminal via a first lead and a first bonding wire of said semiconductor chip including said first test circuit, the third terminal is connected to the second terminal via a second lead and a second bonding wire which differ from the first lead and the first bonding wire of said semiconductor chip including said first test circuit, the fourth terminal is connected to the fifth terminal via a third lead and a third bonding wire of said semiconductor chip including said second test circuit, and the sixth terminal is connected to the fifth terminal via a fourth lead and a fourth bonding wire which differ from the third lead and the third bonding wire of said semiconductor chip including said second test circuit.

22. The test equipment according to claim 21, wherein the first and second terminating resistances are provided to obtain impedance matching of the wiring between the first terminating resistance, the first terminal, the second terminal, the third terminal, and the second terminating resistance, and the third and fourth terminating resistances are provided to obtain impedance matching of the wiring between the third terminating resistance, the fourth terminal, the sixth terminal, the sixth terminal, and the fourth terminating resistance.

23. The test equipment according to claim 22, wherein the high-speed test signal and output signal each have the frequency 200 MHz or more, and the low-speed test signal and output signal each have the frequency less than 200 MHz.

* * * * *